(12) United States Patent
Liu et al.

(10) Patent No.: US 8,421,550 B2
(45) Date of Patent: Apr. 16, 2013

(54) IMPEDANCE MATCHING COMPONENT AND HYBRID WAVE-ABSORBING MATERIAL

(75) Inventors: Ruopeng Liu, Guangdong (CN); Guanxiong Xu, Guangdong (CN); Chunlin Ji, Guangdong (CN); Zhiya Zhao, Guangdong (CN); Nenghui Fang, Guangdong (CN); Yangyang Zhang, Guangdong (CN); Wenjian Wang, Guangdong (CN); Yutao Yue, Guangdong (CN)

(73) Assignees: Kuang-Chi Institute of Advanced Technology, High-Tech Industrial Estate, Nanshan District, Shenzhen, Guangdong (CN); Kuang-Chi Innovative Technology Ltd., FuTian District, Shenzhen, Guangdong (CN)

( * ) Notice: Subject to any disclaimer, the term of this patent is extended or adjusted under 35 U.S.C. 154(b) by 0 days.

(21) Appl. No.: 13/522,499

(22) PCT Filed: Nov. 30, 2011

(86) PCT No.: PCT/CN2011/083208
§ 371 (c)(1),
(2), (4) Date: Jul. 17, 2012

(87) PCT Pub. No.: WO2012/126256
PCT Pub. Date: Sep. 27, 2012

(65) Prior Publication Data
US 2012/0326800 A1    Dec. 27, 2012

(30) Foreign Application Priority Data

Mar. 18, 2011 (CN) .......................... 2011 1 0066479
Mar. 31, 2011 (CN) .......................... 2011 1 0080630
Apr. 30, 2011 (CN) .......................... 2011 1 0111601

(51) Int. Cl.
*H03H 7/38*    (2006.01)
(52) U.S. Cl.
USPC ............................................. 333/32; 333/81 R
(58) Field of Classification Search .................. 333/32, 333/33, 34, 35, 81 R
See application file for complete search history.

(56) References Cited

U.S. PATENT DOCUMENTS

| | | | |
|---|---|---|---|
| 7,538,946 B2 * | 5/2009 | Smith et al. .................. | 359/569 |
| 2012/0280761 A1 * | 11/2012 | Liu et al. ........................ | 333/32 |
| 2013/0002509 A1 * | 1/2013 | Liu et al. ....................... | 343/860 |

\* cited by examiner

*Primary Examiner* — Stephen Jones
(74) *Attorney, Agent, or Firm* — Winston Hsu; Scott Margo

(57) ABSTRACT

Embodiments of the present disclosure relate to an impedance matching component and a hybrid wave-absorbing material. The impedance matching component is disposed between a first medium and a second medium, and comprises a plurality of functional sheet layers. Impedances of the functional sheet layers vary continuously in a stacking direction of the functional sheet layers, with the impedance of a first one of the functional sheet layers being identical to that of the first medium and the impedance of a last one of the functional sheet layers being identical to that of the second medium.

20 Claims, 13 Drawing Sheets

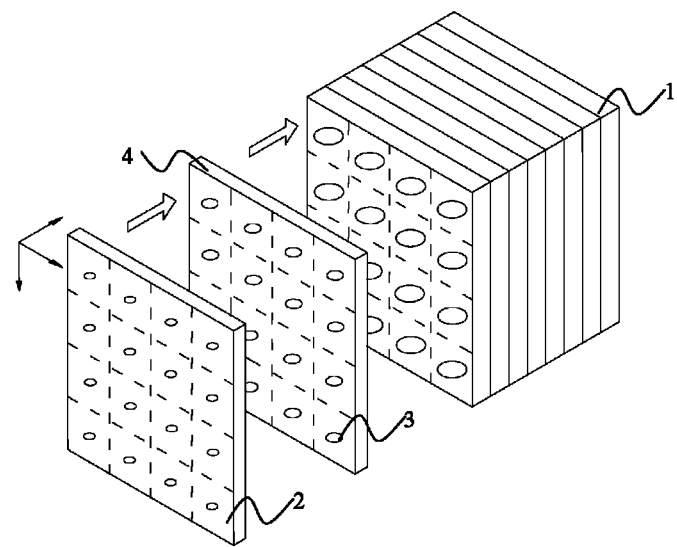
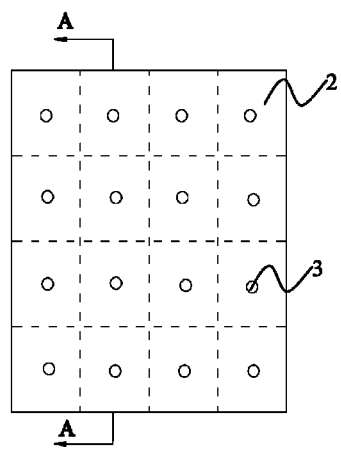 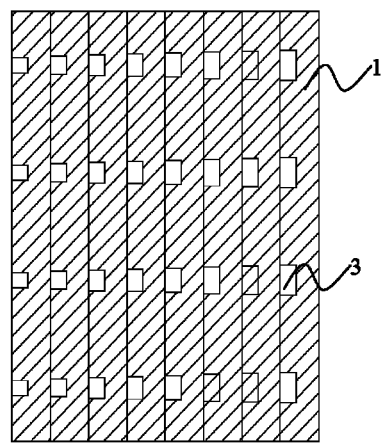
FIG. 1
FIG. 2
FIG. 3

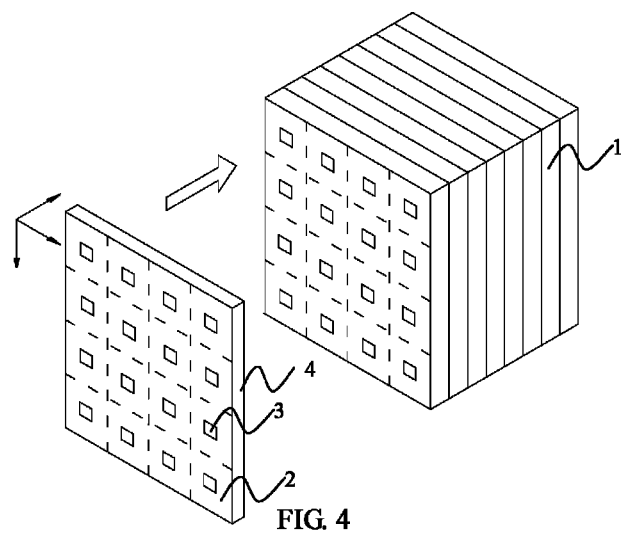
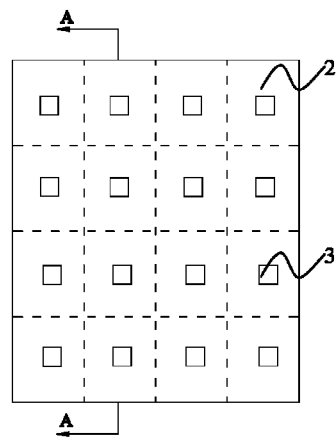
FIG. 5
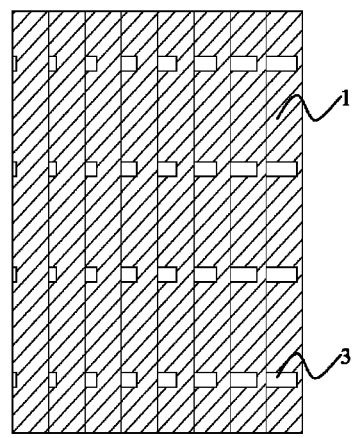
FIG. 6

IMPEDANCE MATCHING COMPONENT AND HYBRID WAVE-ABSORBING MATERIAL

FIELD OF THE INVENTION

The present disclosure generally relates to the technical field of electromagnetic wave communications, and more particularly, to an impedance matching component and a hybrid wave-absorbing material.

BACKGROUND OF THE INVENTION

With continuous development of the science and technologies, the electromagnetic wave technologies have found wide application in various aspects of people's life gradually. An important property of electromagnetic waves is that they can propagate in any media or even in a vacuum. During propagation of an electromagnetic wave from a transmitting terminal to a receiving terminal, the energy loss has a direct impact on the propagation distance of the electromagnetic wave and on the signal transmission quality.

The electromagnetic wave suffers substantially no energy loss when propagating through a same medium. However, when the electromagnetic wave propagates through an interface between different media, partial reflection of the electromagnetic wave will occur. Usually, the larger the difference in electromagnetic parameter (e.g., dielectric permittivity or magnetic permeability) between the different media at two sides of the interface is, the more the reflection will be. Due to the partial reflection of the electromagnetic wave, the electromagnetic wave will suffer an electromagnetic energy loss in the propagation direction, which has a serious impact on the propagation distance of the electromagnetic wave and on the signal transmission quality.

Accordingly, researches have been made on impedance matching in order to reduce signal reflection when the electromagnetic wave propagates through an interface between different media. However, currently the researches on impedance matching during the electromagnetic wave transmission are still limited to be within circuits, and there is still no sophisticated technology directed to impedance matching during propagation of the electromagnetic wave in space.

Further, a wave-absorbing material can absorb and attenuate energy of an incident electromagnetic wave, and through the dielectric loss of the material, convert the energy of the incident electromagnetic wave into thermal energy or other forms of energy. Therefore, the wave-absorbing material is expected to find wide application in electromagnetic pollution control, production of stealth materials and so on. However, in order to make the wave-absorbing material absorb an incident electromagnetic wave as much as possible, heightened requirements are imposed on the impedance-matching property of the wave-absorbing material. By the term "impedance-matching property", it means that an impedance of the wave-absorbing material shall be equal to the free-space's impedance as far as possible so that the energy of the incident electromagnetic wave is absorbed as much as possible. Meanwhile, the attenuating property is also important for the wave-absorbing material. By the term "attenuating property", it means that the incident electromagnetic wave that is absorbed must be consumed as much as possible. Because of the heightened requirements on these two properties, it is very difficult to formulate a wave-absorbing composite material having superior wave-absorbing performances. Moreover, because the wave-absorbing composite material generally has a poor impedance matching property as being limited by the physical property of the material itself, a high reflectance is presented to electromagnetic waves incident from the free space that propagate through the wave-absorbing composite material.

SUMMARY OF THE INVENTION

An objective of the present disclosure is to provide an impedance matching component and a hybrid wave-absorbing material, which are intended to reduce the energy loss of an electromagnetic wave when propagating through an interface between different media.

To achieve the aforesaid objective, the present disclosure provides an impedance matching component, which is disposed between a first medium and a second medium. The impedance matching component comprises a plurality of functional sheet layers. Each of the functional sheet layers comprises a sheet-like substrate and apertures formed on the substrate. The substrate is divided into a plurality of unit cells. Each of the unit cells is formed with one or more of the apertures. Impedances of the functional sheet layers of the impedance matching component vary continuously in a stacking direction of the functional sheet layers, with the impedance of a first one of the functional sheet layers being identical to that of the first medium and the impedance of a last one of the functional sheet layers being identical to that of the second medium.

According to a preferred embodiment of the present disclosure, the apertures on a same one of the substrates have a same volume, and the apertures on different ones of the substrates increase or decrease in volume continuously in the stacking direction of the functional sheet layers.

According to a preferred embodiment of the present disclosure, all the apertures have a same depth, the apertures on the same one of the substrates have a same cross-sectional shape, and cross-sectional areas of the apertures on the different ones of the substrates vary continuously in the stacking direction of the functional sheet layers.

According to a preferred embodiment of the present disclosure, all the apertures have a same cross-sectional area, the apertures on the same one of the substrates have a same cross-sectional shape, and the apertures on the different ones of the substrates vary in depth continuously in the stacking direction of the functional sheet layers.

According to a preferred embodiment of the present disclosure, each of the substrates is formed with a plurality of said apertures identical in volume to each other, each of the unit cells on the same one of the substrates is formed with a same number of said apertures, and the numbers of the apertures in each of the unit cells on the different ones of the substrates increase or decrease continuously in the stacking direction of the functional sheet layers.

According to a preferred embodiment of the present disclosure, each of the apertures is filled with a filler of a same material, and the material of the filler is different from that of the substrate.

According to a preferred embodiment of the present disclosure, all the apertures have a same volume, each of the apertures is filled with a filler of a material different from the substrate, the fillers filled in the apertures on a same one of the substrates have a same dielectric permittivity, and the dielectric permittivities of the fillers filled in the apertures on different ones of the substrates increase or decrease continuously in the stacking direction of the functional sheet layers.

To achieve the aforesaid objective, the present disclosure further provides an impedance matching component, which is disposed between a first medium and a second medium. The impedance matching component comprises a plurality of metamaterial sheet layers parallel to each other and stacked in a direction perpendicular to a surface of each of the metamaterial sheet layers. Each of the metamaterial sheet layers comprises a substrate and a plurality of man-made microstructures attached on the substrate. The substrate is divided into a plurality of lattices in which the man-made microstructures are located. Each of the lattices and the corresponding man-made microstructure(s) formed thereon form one unit cell. Impedances of the unit cells of the impedance matching component vary continuously in a stacking direction of the metamaterial sheet layers, with the impedance of the unit cells of a first one of the metamaterial sheet layers and the impedance of the unit cells of a last one of the metamaterial sheet layers being identical to impedances of the first medium and the second medium with which the first one of the metamaterial sheet layers and the last one of the metamaterial sheet layers are in contact respectively.

According to a preferred embodiment of the present disclosure, both the first medium and the second medium are homogeneous media, and the impedance matching component comprises a plurality of said metamaterial sheet layers each having a uniform impedance arrangement.

According to a preferred embodiment of the present disclosure, the man-made microstructures of all the metamaterial sheet layers of the impedance matching component have a same pattern, and the man-made microstructures of the metamaterial sheet layers vary in size continuously in the stacking direction of the metamaterial sheet layers.

According to a preferred embodiment of the present disclosure, each of the man-made microstructures is of a "I" form, which comprises a first metal wire and two second metal wires connected at two ends of the first metal wire and perpendicular to the first metal wire respectively.

According to a preferred embodiment of the present disclosure, each of the man-made microstructures further comprises third metal wires connected at two ends of each of the second metal wires respectively and perpendicular to the respective second metal wires, fourth metal wires connected at two ends of each of the third metal wires respectively and perpendicular to the respective third metal wires, and so on.

According to a preferred embodiment of the present disclosure, each of the second metal wires has a length smaller than that of the first metal wire, each of the third metal wires has a length smaller than that of each of the second metal wires, each of the fourth metal wires has a length smaller than that of each of the third metal wires, and so on.

According to a preferred embodiment of the present disclosure, each of the man-made microstructures comprises two first metal wires perpendicular to each other and connected in a "+" form, second metal wires connected at two ends of each of the first metal wires respectively and perpendicular to the respective first metal wires, third metal wires connected at two ends of each of the second metal wires respectively and perpendicular to the respective second metal wires, and so on.

According to a preferred embodiment of the present disclosure, each of the man-made microstructures comprises three first metal wires perpendicular to each other in a three-dimensional (3D) space and intersecting with each other at a point, second metal wires connected at two ends of each of the first metal wires respectively and perpendicular to the respective first metal wires, third metal wires connected at two ends of each of the second metal wires respectively and perpendicular to the respective second metal wires, and so on.

According to a preferred embodiment of the present disclosure, each of the man-made microstructures is of a non-axially symmetric configuration.

To achieve the aforesaid objective, the present disclosure further provides a hybrid wave-absorbing material, which comprises an attenuating layer and an impedance matching layer. The impedance matching layer comprise a plurality of homogeneous metamaterial sheet layers. The metamaterial sheet layers are stacked integrally in a direction perpendicular to a surface of each of the metamaterial sheet layers. Impedances of the metamaterial sheet layers vary gradually in the stacking direction of the metamaterial sheet layers, with the impedance of the outermost metamaterial sheet layer being identical to that of a free space and the impedance of the innermost metamaterial sheet layer being identical to that of the attenuating layer.

According to a preferred embodiment of the present disclosure, each of the metamaterial sheet layers comprises a substrate and a plurality of identical man-made microstructures arranged periodically in an array form on the substrate, and the man-made microstructures attached on the metamaterial sheet layers have a same geometric shape and vary in size gradually in the stacking direction of the metamaterial sheet layers, with the man-made microstructures of the outermost metamaterial sheet layer having a smallest size and the man-made microstructures of the innermost metamaterial sheet layer having a greatest size.

According to a preferred embodiment of the present disclosure, each of the man-made microstructures is of a "I" form, which comprises a first metal branch and second metal branches connected at two ends of the first metal branch and perpendicular to the first metal branch respectively.

According to a preferred embodiment of the present disclosure, each of the metamaterial sheet layers comprises a substrate and a plurality of identical man-made microstructures arranged periodically in an array form on the substrate; a plurality of first man-made microstructures having a first pattern is attached on the outermost metamaterial sheet layer, a plurality of second man-made microstructures having a second pattern is attached on the innermost metamaterial sheet layer, and patterns of the plurality of man-made microstructures attached on intermediate ones of the metamaterial sheet layers are all combinations of the first pattern and the second pattern in which the first pattern decreases in size continuously and the second pattern increases in size continuously in the stacking direction of the metamaterial sheet layers.

The aforesaid technical solutions at least have the following benefits: according to the impedance matching component and the hybrid wave-absorbing material of the present disclosure, the impedance matching component has a graded impedance, with an impedance thereof at a side being identical to that of a first medium and an impedance thereof at the other side being identical to that of a second medium, while impedances of the intermediate portions change continuously, which eliminate sudden transitions of the impedance between the first medium and the second medium. Thereby, the problems of partial reflection and energy loss of electromagnetic waves when propagating through an interface between different media are overcome. Furthermore, the hybrid wave-absorbing material of the present disclosure has improved wave-absorbing performances.

BRIEF DESCRIPTION OF THE DRAWINGS

FIG. 1 is a schematic structural view illustrating a first embodiment of an impedance matching component based on the hybrid material process of the present disclosure;

FIG. 2 is a front view of the impedance matching component based on the hybrid material process shown in FIG. 1;

FIG. 3 is an A-A cross-sectional view of the impedance matching component based on the hybrid material process shown in FIG. 2;

FIG. 4 is a schematic structural view illustrating a second embodiment of the impedance matching component based on the hybrid material process of the present disclosure;

FIG. 5 is a front view of the impedance matching component based on the hybrid material process shown in FIG. 4;

FIG. 6 is an A-A cross-sectional view of the impedance matching component based on the hybrid material process shown in FIG. 5;

FIG. 10c is a side view of the impedance matching component shown in FIG. 10a;

FIG. 11b is a schematic view of another embodiment derived from the man-made microstructure shown in FIG. 11a;

FIG. 12b is a schematic view of an embodiment derived from one of the man-made microstructures shown in FIG. 12a;

DETAILED DESCRIPTION OF THE INVENTION

Figure 7:
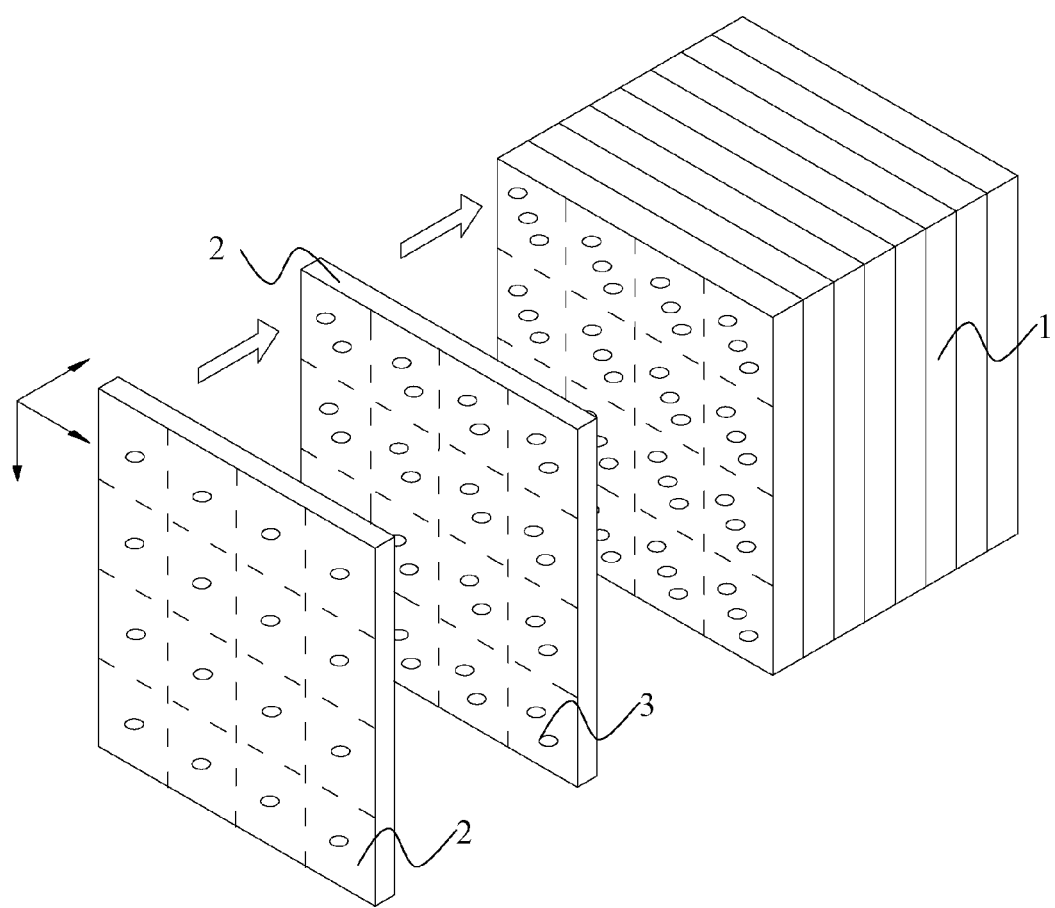
FIG. 7 is a schematic structural view illustrating a third embodiment of the impedance matching component based on the hybrid material process of the present disclosure.

The electromagnetic wave suffers substantially no energy loss when propagating through a same medium. However, when the electromagnetic wave propagates through an interface between different media, partial reflection of the electromagnetic wave will occur. Usually, the larger the difference in electromagnetic parameter (e.g., dielectric permittivity or magnetic permeability) between the different media at two sides of the interface is, the more the reflection will be. Due to the partial reflection of the electromagnetic wave, the electromagnetic wave will suffer an electromagnetic energy loss in the propagation direction, which has a serious impact on the propagation distance of the electromagnetic wave and on the signal transmission quality. The present disclosure relates to an impedance matching component, which is intended to overcome the problem of energy loss of the electromagnetic wave due to partial reflection occurring when the electromagnetic wave passes through an interface between different media during propagation in the space.

When apertures are formed in some regions of a piece of material having a uniform electromagnetic parameter arrangement, the electromagnetic parameter arrangement in these regions of the material will be changed because the air is filled into the apertures. According to the aforesaid principle, the electromagnetic parameter arrangement in these regions of the material can be adjusted by analyzing interactions between the electromagnetic parameters of the material and the electromagnetic parameters of the air and controlling the number and the size of the apertures. Then, according to the electromagnetic parameter arrangements required in the individual regions, different macroscopic responses of the whole material to an electromagnetic wave can be achieved. In order to achieve the macroscopic responses of the material to the electromagnetic wave, the size of the apertures and portions of the materials where the apertures are located must be smaller than one fifth of and are preferably one tenth of the wavelength of the corresponding electromagnetic wave. Because the impedance of the material is proportional to $\sqrt{\mu/\varepsilon}$, the impedance of the material can be changed by changing one or both of the dielectric permittivity and the magnetic permeability. According to the aforesaid principle, by stacking a plurality of materials having different impedances together to form an impedance gradient layer, sudden transitions of the impedance between two media can be eliminated. Thereby, the problems of reflection and energy loss of the electromagnetic wave when propagating through an interface between different media are overcome.

FIG. 1 to FIG. 3 are a schematic structural view, a front view and an A-A cross-sectional view illustrating a first embodiment of an impedance matching component based on the hybrid material process of the present disclosure respectively. The impedance matching component is disposed between a first medium and a second medium to eliminate reflection of an electromagnetic wave when propagating through an interface between the two media. The impedance matching component comprises a plurality of functional sheet layers 4 that each have a front surface and a back surface parallel to each other and that are stacked in a direction perpendicular to the surfaces of each of the functional sheet layers 4. Each of the functional sheet layers 4 comprises a sheet-like substrate 1 and apertures 3 formed on the substrate 1. Each of the substrates 1 is divided into a plurality of unit cells 2, and each of the unit cells 2 is formed with one or more of the apertures 3. An impedance of the first one of the functional sheet layers 4 is identical to that of the first medium and an impedance of the last one of the functional sheet layers 4 is identical to that of the second medium. Impedances of the intermediate functional sheet layers 4 vary continuously in a stacking direction of the substrates 1 to form an impedance gradient layer. The size of each of the unit cells 2 is determined by a frequency of a corresponding electromagnetic wave, and is usually one tenth of a wavelength of the corresponding electromagnetic wave (otherwise, arrangement of the apertures 3 cannot be viewed as being continuous in the space).

In this embodiment, the apertures 3 on the substrates 1 all have the same depth, the apertures 3 on a same substrate 1 have the same cross-sectional area, and the cross-sectional areas of the apertures 3 on the different substrates 1 increase continuously in the stacking direction of the functional sheet layers 4. The apertures 3 in this embodiment are all of a cylindrical form, and the apertures 3 on a same substrate 1 are uniformly distributed on the substrate 1. The term "uniformly distribute" herein means that a circle center of a cross section of any aperture 3 is equidistant from circle centers of cross sections of the apertures 3 around the aperture 3. Because of presence of the cylindrical apertures 3, both an equivalent dielectric permittivity and an equivalent magnetic permeability of each of the unit cells 2 are changed. The apertures 3 of the unit cells 2 on a same substrate 1 have the same volume, so the apertures 3 are tilled with the same amount of air and the unit cells 2 on a same functional sheet layer 4 have the same equivalent dielectric permittivity. The apertures 3 on different substrates 1 have different volumes which increase continuously in the stacking direction of the substrates 1, so the impedance matching component of this embodiment forms an impedance gradient layer in the stacking direction of the functional sheet layers 4. In practical implementations, the apertures 3 of some other different cross-sectional shape are also possible, for example, the apertures 3 of a polygonal form such as a triangular form, a square form and a regularly pentagonal form. Provided that all the apertures 3 on a same substrate 1 have the same cross-sectional area and the cross-sectional areas of the apertures 3 on the different substrates 1 increase or decrease continuously in the stacking direction of the functional sheet layers 4, an impedance gradient layer can be formed to eliminate sudden transitions of the impedance at the interface.

FIG. 4 to FIG. 6 are a schematic structural view, a front view and an A-A cross-sectional view illustrating a second embodiment of the impedance matching component based on the hybrid material process of the present disclosure respectively. In this embodiment, the impedance matching component comprises a plurality of functional sheet layers 4 that each have a front surface and a back surface parallel to each other and that are stacked in a direction perpendicular to the surfaces of each of the functional sheet layers 4. Each of the functional sheet layers 4 comprises a sheet-like substrate 1 and a plurality of apertures 3 formed on the substrate 1. Each of the substrates 1 is divided into a plurality of unit cells 2, and each of the unit cells 2 is formed with one or more of the apertures 3. An impedance of the first one of the functional sheet layers 4 is identical to that of a first medium and an impedance of the last one of the functional sheet layers 4 is identical to that of a second medium. Impedances of the intermediate functional sheet layers 4 vary continuously in a stacking direction of the functional sheet layers 4 to form an impedance gradient layer. The size of each of the unit cells 2 is determined by a frequency of a corresponding electromagnetic wave, and is usually one tenth of a wavelength of the corresponding electromagnetic wave (otherwise, arrangement of the apertures 3 cannot be viewed as being continuous in the space).

In this embodiment, the apertures 3 on the substrates 1 all have the same cross-sectional area, the apertures 3 on a same substrate 1 have the same depth, and the depths of the apertures 3 on the different substrates 1 increase continuously in the stacking direction of the functional sheet layers 4. The apertures 3 in this embodiment are all of a cubic form, and the apertures 3 on a same substrate 1 are uniformly distributed on the substrate 1. The term "uniformly distribute" herein means that a circle center of a circumcircle of a cross section of any aperture 3 is equidistant from circle centers of circumcircles of cross sections of the apertures 3 around the aperture 3.

In this embodiment, the apertures 3 of the unit cells 2 on a same substrate 1 have the same volume, so the apertures 3 are filled with the same amount of air and the unit cells on a same functional sheet layer 4 have the same equivalent dielectric permittivity; and the apertures 3 on different substrates 1 have different volumes which increase continuously in the stacking direction of the functional sheet layers 4, so the impedance matching component of this embodiment forms an impedance gradient layer in the stacking direction of the functional sheet layers 4. In practical implementations, the apertures 3 of some other different cross-sectional shape are also possible, for example, the apertures 3 of a polygonal form such as a triangular form, a square form and a regularly pentagonal form. Provided that all the apertures 3 on a same substrate 1 have the same depth and the depths of the apertures 3 on the different substrates 1 increase or decrease continuously in the stacking direction of the functional sheet layers 4, an impedance gradient layer can be formed to eliminate sudden transitions of the impedance at the interface.

FIG. 7 is a schematic structural view illustrating a third embodiment of the impedance matching component of the present disclosure. In this embodiment, the impedance matching component comprises a plurality of functional sheet layers 4 that each have a front surface and a back surface parallel to each other and that are stacked in a direction perpendicular to the surfaces of each of the functional sheet layers 4. Each of the functional sheet layers 4 comprises a sheet-like substrate 1 and a plurality of apertures 3 formed on the substrate 1. Each of the substrates 1 is divided into a plurality of unit cells 2, and each of the unit cells 2 is formed with one or more of the apertures 3. An impedance of the first one of the functional sheet layers 4 is identical to that of a first medium and an impedance of the last one of the functional sheet layers 4 is identical to that of a second medium. Impedances of the intermediate functional sheet layers 4 vary continuously in a stacking direction of the functional sheet layers 4 to form an impedance gradient layer. In this embodiment, each of the unit cells 2 of a same substrate 1 is formed with the same number of apertures 3, and the numbers of the apertures 3 in each of the unit cells 2 on the different substrates 1 increase or decrease continuously in the stacking direction of the functional sheet layers 4. In this embodiment, the apertures 3 in each of the unit cells 2 of a same substrate 1 have the same total volume, the unit cells on a same functional sheet layer 4 all have the same equivalent dielectric permittivity, and the total volume of the apertures 3 in each of the unit cells 2 is different for different substrates 1 and increases continuously in the stacking direction of the functional sheet layers 4. Therefore, the impedance matching component of this embodiment forms an impedance gradient layer in the stacking direction of the functional sheet layers 4.

In the aforesaid three preferred embodiments, the apertures 3 in each of the unit cells 2 of a same substrate 1 have the same total volume, and the total volume of the apertures 3 in each of the unit cells 2 on different substrates 1 increases or decreases continuously in the stacking direction of the functional sheet layers 4. This makes the manufacturing process convenient and the mold manufacturing process simple.

In practical implementations, the apertures 3 may also be conical apertures, circular-truncated-cone-like apertures, or apertures of some other form. Provided that the apertures 3 on a same substrate 1 have the same volume and the apertures 3 on different substrates 1 increase or decrease in volume continuously in the stacking direction of the functional sheet layers 4, an impedance gradient layer can be formed to achieve the purpose of impedance matching.

Figure 8:
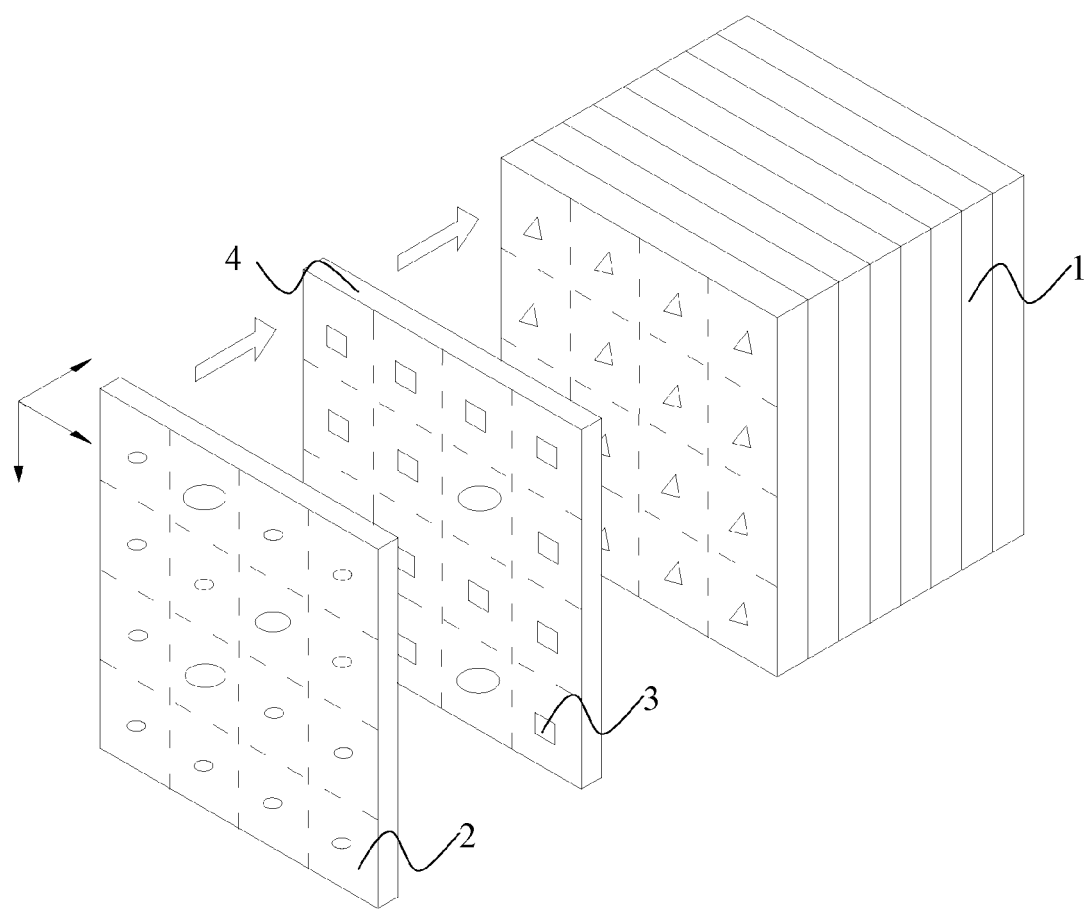
FIG. 8 is a schematic structural view illustrating a fourth embodiment of the impedance matching component based on the hybrid material process of the present disclosure.

FIG. 8 is a schematic structural view illustrating a fourth embodiment of the impedance matching component based on the hybrid material process of the present disclosure. In this embodiment, the impedance matching component comprises a plurality of functional sheet layers 4 that each have a front surface and a back surface parallel to each other and that are stacked in a direction perpendicular to the surfaces of each of the functional sheet layers 4. Each of the functional sheet layers 4 comprises a sheet-like substrate 1 and a plurality of apertures 3 formed on the substrate 1. Each of the substrates 1 is divided into a plurality of unit cells 2, and each of the unit cells 2 is formed with one or more of the apertures 3. An impedance of the first one of the functional sheet layers 4 is identical to that of a first medium and an impedance of the last one of the functional sheet layers 4 is identical to that of a second medium. Impedances of the intermediate functional sheet layers 4 vary continuously in a stacking direction of the functional sheet layers 4 to form an impedance gradient layer. In this embodiment, the apertures 3 on a same substrate 1 are not completely identical in shape, cross-sectional size and depth; however, an impedance gradient layer can be formed to eliminate sudden transitions of the impedance at the interface so long as all the apertures 3 on a same substrate 1 have the same volume and the apertures 3 on the different substrates 1 increase or decrease in volume continuously in the stacking direction of the functional sheet layers 4. As compared to the impedance matching components of the aforesaid two embodiments, the impedance matching component of this embodiment is difficult to manufacture and requires a complex mold manufacturing process.

In the aforesaid embodiment, the electromagnetic parameter arrangement in some regions of the material is changed because of the air filled into the apertures. In practical implementations, the apertures 3 of the aforesaid embodiment may also be filled with a filler of some other material different from that of the substrate 1 such as iodine crystals, copper oxide, crystals, quartz, polystyrene, sodium chloride or glass. In the embodiments shown in FIG. 1 and FIG. 2, the apertures 3 on all the substrates 3 may be filled with the same material, each of the functional sheet layers 4 has a uniform impedance arrangement, and the functional sheet layers 4 can form an impedance gradient layer.

In practical implementations, all the substrates 1 may be formed with the apertures 3 having the same volume, the filler filled in the apertures 3 of a same functional sheet layer 4 has a same dielectric permittivity, and the dielectric permittivity of the filler filled in the apertures 3 of the different functional sheet layers 4 increases or decreases continuously in the stacking direction of the functional sheet layers. Through design of positions, the number and the arrangement of sizes of the apertures 3 and selection of the type of the filler material, the equivalent electromagnetic parameters of the unit cells 2 of each of the substrates 1 can be adjusted within a larger range so as to satisfy various requirements on control of the electromagnetic wave. Each of the substrates 1 is made of a ceramic material, a polymer material, a ferroelectric material, a ferrite material or a ferromagnetic material, and the polymer material may be polytetrafluoroethylene (PTFE), an Fr4 material or an F4b material. The apertures 3 may be formed on the substrates 1 through injection molding, stamping, or digitally controlled punching. If the substrates 1 are made of a ceramic material, the substrates 1 having the apertures 3 may be made through high-temperature sintering. In all the aforesaid embodiments, the apertures 3 may be through holes or blind holes.

Figure 9:
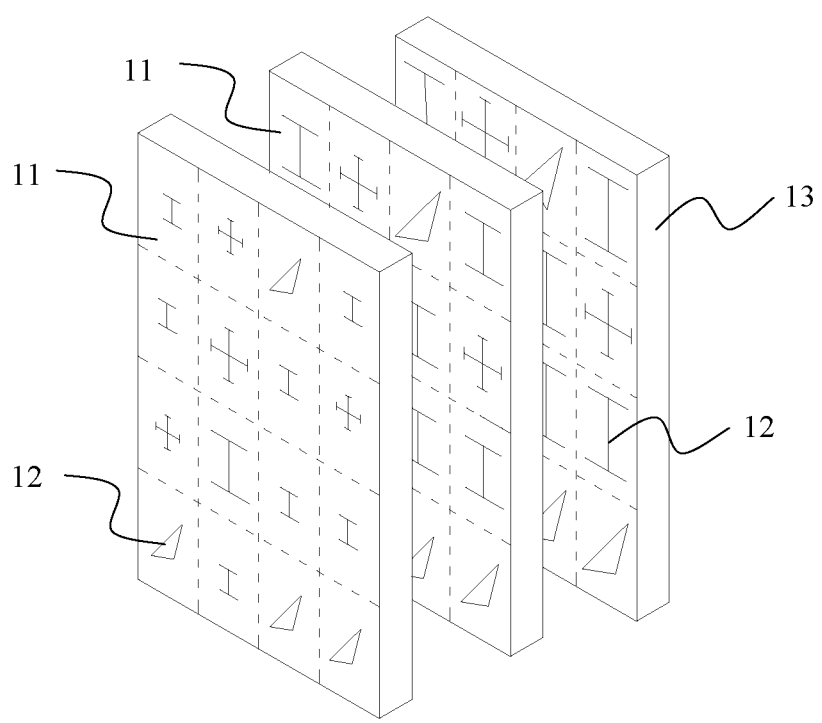
FIG. 9 is a schematic structural view illustrating a fifth embodiment of an impedance matching component of the present disclosure which is formed of a plurality of inhomogeneous metamaterial sheet layers stacked together.

FIG. 9 is a schematic structural view illustrating an embodiment of an impedance matching component used between two inhomogeneous media. The metamaterial is a kind of novel material that is formed by man-made microstructures 12 as basic units arranged in the space in a particular manner and that has predetermined electromagnetic responses. The metamaterial comprises man-made microstructures 12 comprising metal wires having a predetermined pattern, and a substrates 11 on which the man-made microstructures are attached. A plurality of man-made microstructures 12 are arranged in an array form on the substrate 11, the substrate 11 is divided into a plurality of lattices, and each of the man-made microstructures 12 and one of the lattices on which the man-made microstructure 12 is attached form one unit cell. The substrate 11 may be made of any material different from that of the man-made microstructures 12, and use of the two materials imparts to each of the unit cells an equivalent dielectric permittivity and an equivalent magnetic permeability, which correspond to the responses of the unit cell to the electric field and the magnetic field respectively. The electromagnetic response of the metamaterial is determined by electromagnetic response of the man-made microstructures 12 which, in turn, is largely determined by topologies of the metal wire patterns of and the geometric dimensions of the man-made microstructures 12.

By designing the pattern and the geometric dimensions of each of the man-made microstructures 12 of the metamaterial that are arranged in the space according to the aforesaid principle, the electromagnetic parameters of each point in the metamaterial can be set. Because the impedance is directly proportional to $\sqrt{\mu/\varepsilon}$, the impedance can be changed by changing at least one of the dielectric permittivity and the magnetic permeability. As has been proved through experiments, for the man-made microstructures 12 having the same pattern, the geometric dimensions thereof are directly proportional to the dielectric permittivity. Therefore, by appropriately designing the patterns of the man-made microstructures 12 and designing arrangement of the man-made microstructures 12 of different dimensions on the metamaterial sheet layers, an impedance gradient layer can be formed by the metamaterial, with an impedance of the impedance gradient layer at one side being identical to that of the first medium and an impedance of the impedance gradient layer at the other side being identical to that of the second medium. The continuous changes in the intermediate portion eliminate sudden transitions of the impedance between the first medium and the second medium. Thereby, the problems of reflection and energy loss of the electromagnetic wave when propagating through an interface between different media are overcome.

The impedance matching component of this embodiment comprises a plurality of metamaterial sheet layers 13 parallel to each other and stacked in a direction perpendicular to a surface of each of the metamaterial sheet layers 13. Each of the metamaterial sheet layers 13 is divided into multiple unit cells. Impedances of the unit cells vary continuously in a stacking direction of the metamaterial sheet layers 13, with the impedance of the unit cells of the first one of the metamaterial sheet layers 13 and the impedance of the unit cells of the last one of the metamaterial sheet layers 13 being identical to the impedances of the first medium and the second medium with which the first metamaterial sheet layer 13 and the last metamaterial sheet layer 13 are in contact respectively. When the impedance matching component of the present disclosure is used for impedance matching between inhomogeneous media, the first metamaterial sheet layer 13 and the last metamaterial sheet layer 13 are inhomogeneous. By designing the patterns and the dimensions of the man-made microstructures 12 on the unit cells of the first metamaterial sheet layer 13 and the last metamaterial sheet layer 13, continuous variations in impedance of the unit cells of the intermediate metamaterial sheet layers 13 can eliminate sudden transitions of the impedance between the first medium and the second medium to achieve impedance matching. In practical implementations, the patterns and the dimensions of the man-made microstructures 12 attached on the unit cells of the first metamaterial sheet layer 13 and the last metamaterial sheet layer 13 can be designed according to the impedances corresponding to the first medium and the second medium; and the man-made microstructures 12 may be of a "I" form, a triangular form shown in FIG. 9, or any other form satisfying the requirements on the impedance.

Hereinbelow, an embodiment in which the impedance matching component of the present disclosure is used between two homogeneous media will be described.

FIG. 10a to FIG. 10d are a schematic structural view, a front view, a side view and an A-A cross-sectional view illustrating an embodiment of the impedance matching component of the present disclosure respectively. In this embodiment, both the first medium and the second medium are homogeneous media, the impedance matching component is comprised of a plurality of metamaterial sheet layers 13 each having a uniform impedance arrangement, and each of the metamaterial sheet layers 13 comprises a sheet-like substrate 11 and a plurality of man-made microstructures 12 attached on the substrate 11. The metamaterial sheet layers 13 are stacked integrally in a direction perpendicular to a surface of each of the metamaterial sheet layers 13, and impedances of the metamaterial sheet layers 13 increase or decrease gradually in a stacking direction of the metamaterial sheet layers 13, with the impedance of the first one of the metamaterial sheet layers 13 and the impedance of the last one of the metamaterial sheet layers 13 being identical to an impedance of the first medium and an impedance of the second medium respectively. The term "homogeneous" described herein means that each of the unit cells of a metamaterial sheet layer 13 has the same electromagnetic parameters.

The impedance matching component of this embodiment comprises the metamaterial sheet layers 13 stacked together, and a plurality of identical man-made microstructures 12 are arranged in an array form on the substrate 11 of a same metamaterial sheet layer 13. The man-made microstructures 12 attached on the different metamaterial sheet layers 13 have the same geometric shape and increase or decrease in size gradually in the stacking direction of the metamaterial sheet layers 13. In practical implementations, the electromagnetic parameters of the metamaterial sheet layers 13 at two sides of the impedance matching component can be designed according to the impedances of the first medium and the second medium, with the impedances of the intermediate metamaterial sheet layers 13 varying continuously to form an impedance gradient layer.

In this embodiment, each of the man-made microstructures 12 is of a "I" form, which comprises a vertical first metal wire 201 and second metal wires 202 connected at two ends of the first metal wire 201 and perpendicular to the first metal wire 201 respectively.

Figure 10A:
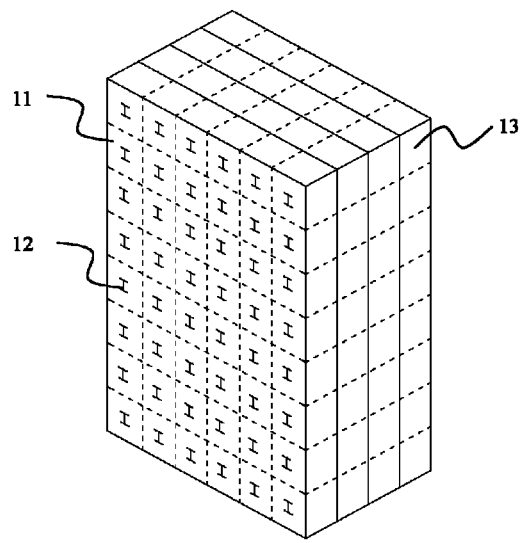
FIG. 10a is a schematic structural view illustrating a sixth embodiment of an impedance matching component of the present disclosure which is formed of a plurality of homogeneous metamaterial sheet layers stacked together.
Figure 10B:
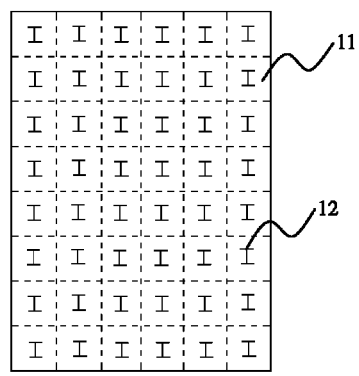
FIG. 10b is a front view of the impedance matching component shown in FIG. 10a whose man-made microstructures are each of a "I" form.
Figure 10C:
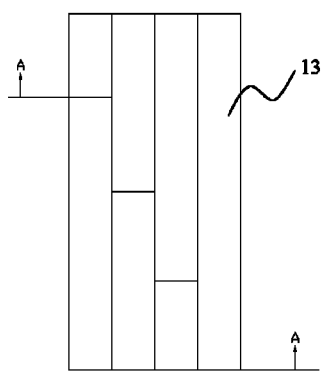
Figure 10D:
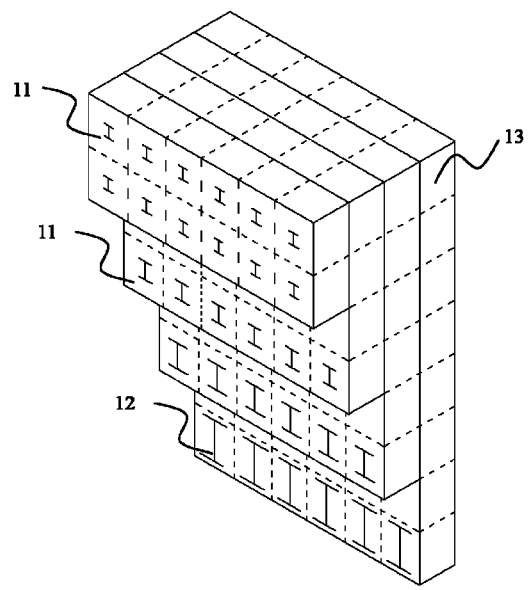
FIG. 10d is an A-A cross-sectional view of the impedance matching component shown in FIG. 10c, with impedances of the metamaterial sheet layers increasing or decreasing steadily in a stacking direction.
Figure 11A:
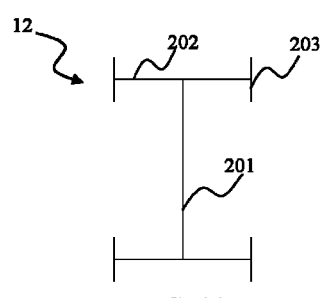
FIG. 11a is a schematic view of an embodiment derived from one of the man-made microstructures shown in FIG. 10b.

FIG. 11a illustrates an embodiment derived from the embodiment shown in FIG. 10b. In this embodiment, each of the man-made microstructures 12 not only comprises the first metal wire 201 and the second metal wires 202 constituting the "I" form, but also comprises third metal wires 203 connected at two ends of each of the second metal wires 202 respectively and perpendicular to the respective second metal wires 202.

Figure 11B:
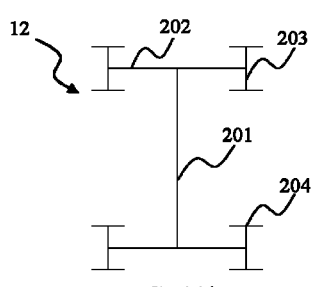

FIG. 11b illustrates an embodiment that is further derived from the man-made microstructure 12 shown in FIG. 11a. As compared to the man-made microstructure 12 shown in FIG. 11a, each of the man-made microstructures 12 of this embodiment further comprises fourth metal wires 204 connected at two ends of each of the third metal wires 203 respectively and perpendicular to the respective third metal wires 203. In this way, an infinite number of forms may be derived for the man-made microstructures 12 of the present disclosure that are responsive to the electric field. Each of the second metal wires 202 has a length smaller than that of the first metal wire 201, each of the third metal wires 203 has a length smaller than that of each of the second metal wires 202, each of the fourth metal wires 204 has a length smaller than that of each of the third metal wires 203, and so on.

The first metal wire 201 is only connected with the second metal wires 202, and does not intersect with any other metal wire. Any $N^{th}$ metal wire is only connected with the corresponding $(N+1)^{th}$ metal wires and a corresponding one of the $(N-1)^{th}$ metal wire(s), and does not intersect with any other metal wire, where N is larger than or equal to 2.

Figure 12A:
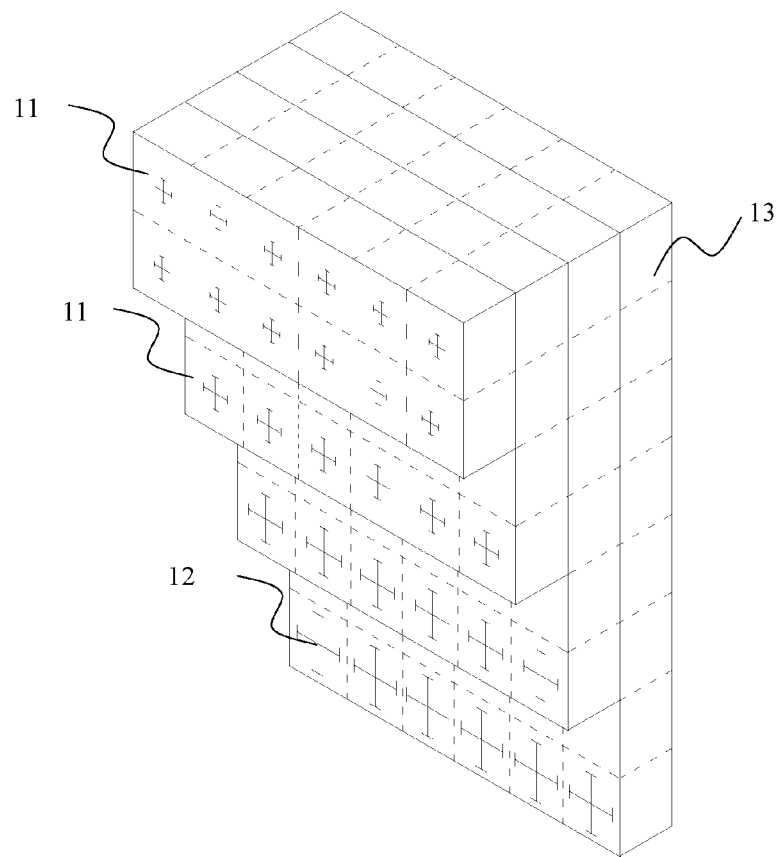
FIG. 12a is a cross-sectional view illustrating a seventh embodiment of the impedance matching component of the present disclosure.

In an embodiment shown in FIG. 12a, the metal wires of each of the man-made microstructures 12 comprise two first metal wires 201 perpendicular to each other and connected in a "+" form, and second metal wires 202 connected at two ends of each of the first metal wires 201 respectively and perpendicular to the respective first metal wires 201. A plurality of identical man-made microstructures 12 are arranged in an array form on a same metamaterial sheet layer 13; and the man-made microstructures 12 attached on the different metamaterial sheet layers 13 have the same geometric shape and increase or decrease in size gradually in the stacking direction of the metamaterial sheet layers 13.

Figure 12B:
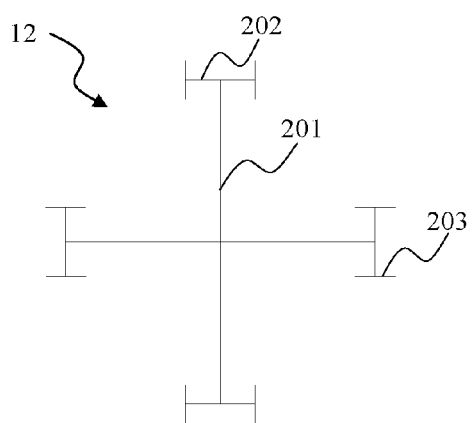
Figure 12C:
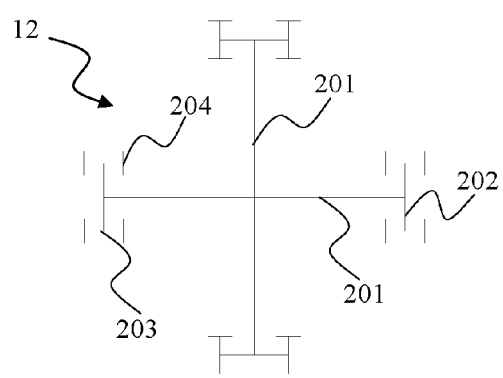
FIG. 12c is a schematic view of another embodiment derived from the man-made microstructure shown in FIG. 12b.

FIG. 12b and FIG. 12c illustrate embodiments derived from one of the man-made microstructures 12 shown in FIG. 12a. In addition to the first metal wires 201 and the second metal wires 202 shown in FIG. 12a, the metal wires shown in FIG. 12b further comprise third metal wires 203 connected at two ends of each of the second metal wires 202 respectively and perpendicular to the respective second metal wires 202. In addition to the first metal wires 201, the second metal wires 202 and the third metal wires 203 shown in FIG. 12b, the metal wires shown in FIG. 12c further comprise fourth metal wires 204 connected at two ends of each of the third metal wires 203 respectively and perpendicular to the respective third metal wires 203. Each of the man-made microstructures 12 of the present disclosure may further comprise fifth metal wires connected at two ends of each of the fourth metal wires 204 respectively and perpendicular to the respective fourth metal wires 204, and so on.

Figure 13:
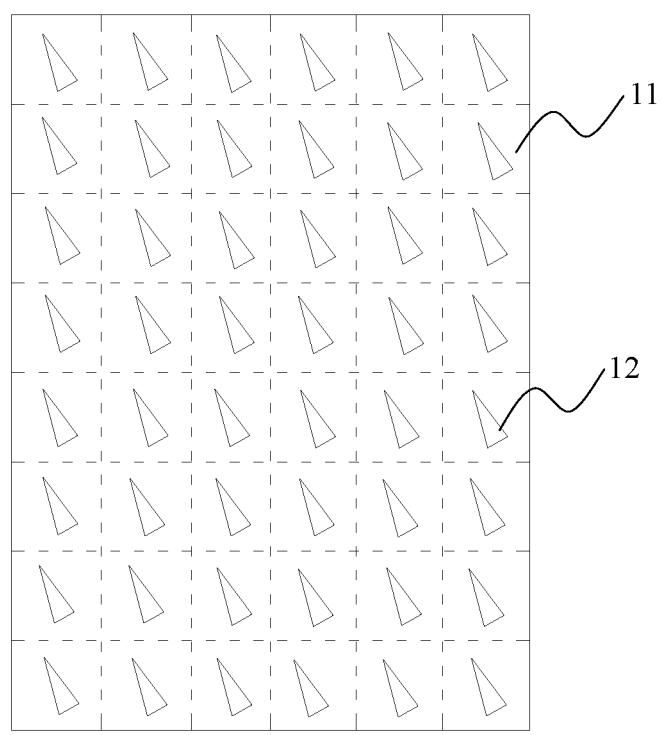
FIG. 13 is a front view illustrating an eighth embodiment of the impedance matching component of the present disclosure.
Figure 14:
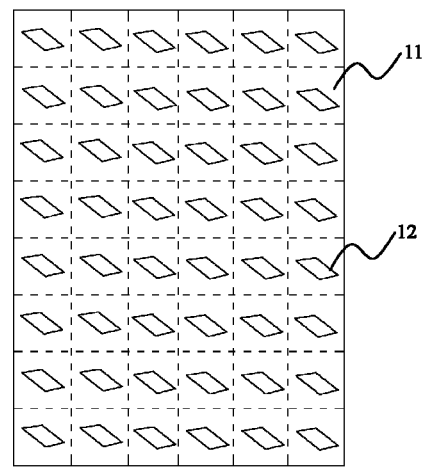
FIG. 14 is a front view illustrating a ninth embodiment of the impedance matching component of the present disclosure.
Figure 15:
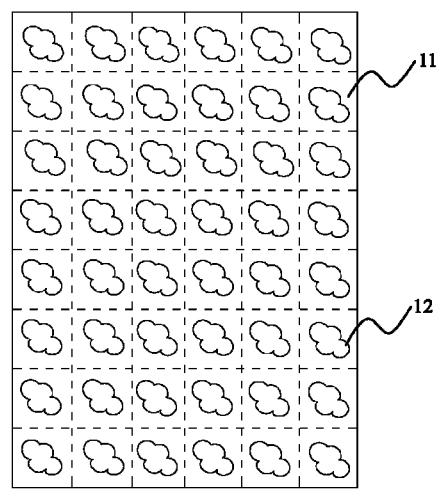
FIG. 15 is a front view illustrating a tenth embodiment of the impedance matching component of the present disclosure.

In embodiments shown in FIG. 13 to FIG. 15, the man-made microstructures 12 of the impedance matching component are of the form of a non-isosceles triangle, a parallelogram and an irregular closed curve. Likewise, the man-made microstructures 12 of any other axially symmetric or non-axially symmetric structure are also possible. The man-made microstructures 12 of these embodiments are the same as those of the aforesaid embodiments except the geometric shapes thereof. Provided that the metamaterial sheet layers 13 of the impedance matching component form one impedance gradient layer, sudden transitions of the impedance between different media can be eliminated so as to avoid energy loss of the electromagnetic wave when propagating through an interface between the different media.

Figure 16:
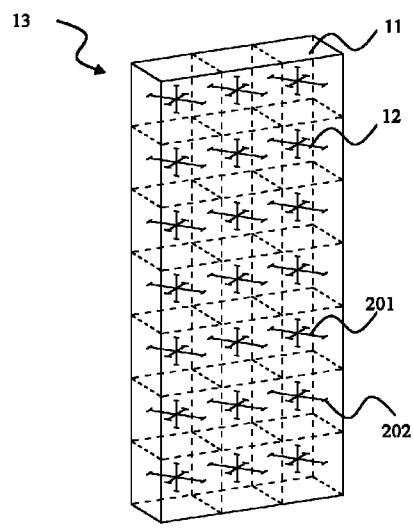
FIG. 16 is a schematic structural view illustrating a metamaterial sheet layer having 3D man-made microstructures.

The metamaterial sheet layer 13 shown in FIG. 16 has three-dimensional (3D) man-made microstructures 12. The 3D man-made microstructures 12 are uniformly arranged in the sheet-like substrate 11 in an array form and in parallel with each other. In design of the man-made microstructures 12, the impedance gradient of the impedance matching component can be adjusted by designing the length relationships between the metal wires.

Each of the man-made microstructures 12 of this embodiment comprises three first metal wires 201 perpendicular to each other and intersecting with each other at a point, sixth second metal wires 202 connected at two ends of each of the first metal wires 201 respectively and perpendicular to the respective first metal wires 201, and so on.

Figure 17:
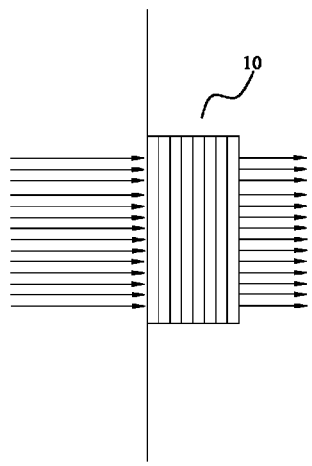
FIG. 17 is a schematic view illustrating an application of the impedance matching component of the present disclosure.

In the impedance matching component of the present disclosure, the electromagnetic parameters of each point in the metamaterial can be set according to the principle that topologies of the patterns of and the geometric dimensions of the man-made microstructures have an impact on the electromagnetic parameters of the metamaterial. The impedance is directly proportional to $\sqrt{\mu/\varepsilon}$, so the problems of reflection and energy loss of the electromagnetic wave when propagating through an interface between different media can be overcome by appropriately setting the electromagnetic parameters of each point in the metamaterial and using the metamaterial to form an impedance matching component whose impedance varies gradually. FIG. 17 is a schematic view illustrating an application of the impedance matching component of the present disclosure. The impedance matching component 10 of the present disclosure is disposed between two different media; and patterns and dimensions of the man-made microstructures 12 of the metamaterial sheet layers, which make contact with the first medium and the second medium respectively, of the impedance matching component can be designed according to the electromagnetic parameters of the first medium and the second medium. When the two media are both homogenous media, for convenience of understanding and description, a plurality of identical man-made microstructures are attached on a same metamaterial sheet layer of the impedance matching component; and the man-made microstructures attached on the different metamaterial sheet layers have the same geometric shape and increase or decrease in size gradually in the stacking direction of the metamaterial sheet layers. In practical designs, the different metamaterial sheet layers may also adopt the man-made microstructures having different patterns provided that the impedances of the metamaterial sheet layers increase or decrease gradually in the stacking direction of the metamaterial sheet layers to achieve impedance matching between the homogenous media, which shall all be covered within the scope of the present disclosure.

Figure 18:
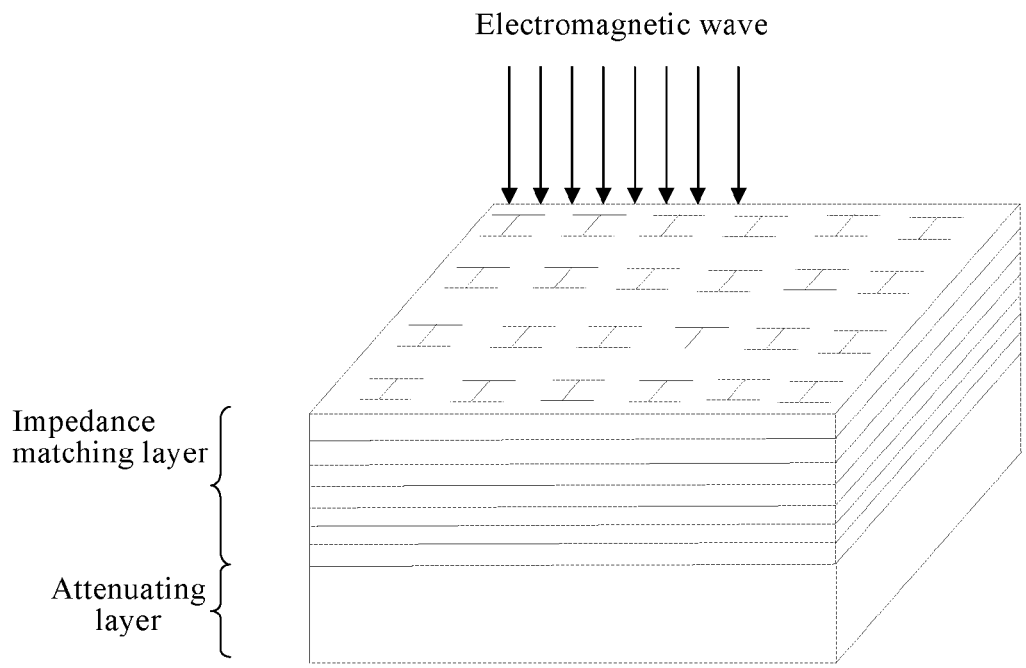
FIG. 18 is a schematic structural view illustrating a hybrid wave-absorbing material of the present disclosure.

Referring to FIG. 18, there is shown a schematic structural view illustrating a hybrid wave-absorbing material of the present disclosure. The hybrid wave-absorbing material of the present disclosure comprises a conventional wave-absorbing material as an attenuating layer, and an impedance matching layer that has the impedance matching function is disposed on the conventional wave-absorbing material serving as a base. Because of disposition of the impedance matching layer, only the attenuating property of the conventional wave-absorbing material needs to be considered when the conventional wave-absorbing material is used. Therefore, the conventional wave-absorbing material of the present disclosure refers to any kind of common wave-absorbing material having a high loss factor, including ferrites having high magnetic medium loss, conductive polymers having high resistive loss, carbon black having high dielectric loss, $BaTiO_3$, $FeTiO_3$, $PbTiO_3$ and so on. The attenuating layer is not merely limited to the aforesaid examples for the conventional wave-absorbing material, which all have an excellent attenuating property and an impedance Zn.

After the conventional wave-absorbing material base having an excellent attenuating property is chosen, the impedance matching layer formed of the metamaterial must be designed in such a way that an impedance to an electromagnetic wave incident from the free space varies gradually from the impedance $Z_0$ in the free space to the impedance Zn in the conventional wave-absorbing material base. Thereby, the electromagnetic wave is not reflected when propagating through the hybrid wave-absorbing material, and is finally absorbed by the conventional wave-absorbing material.

The so-called metamaterial is a kind of novel material that is formed by man-made microstructures as basic units arranged in the space in a particular manner and that has predetermined electromagnetic responses. The metamaterial comprises man-made microstructures comprising metal branches having a predetermined pattern, and a substrate on which the man-made microstructures are attached. A plurality of man-made microstructures are arranged in an array form on the substrate, and each of the man-made microstructures and a portion of the substrate occupied thereby form one metamaterial unit. Any adjacent ones of the man-made microstructures shall be spaced apart by a distance of one tenth to one fifth of the wavelength of an incident electromagnetic wave so as to make a continuous electromagnetic response to the incident electromagnetic wave. The substrate may be made of any material different from that of the man-made microstructures, and use of the two materials imparts to each of the metamaterial units an equivalent dielectric permittivity and an equivalent magnetic permeability, which correspond to the responses of each of the metamaterial units to the electric field and the magnetic field respectively. The electromagnetic response of the metamaterial is determined by electromagnetic response of the man-made microstructures which, in turn, is largely determined by topologies of the patterns of the metal branches of and the geometric dimensions of the man-made microstructures.

The impedance of each of the man-made microstructures can be derived from the formula $Z=R+j\omega L+1/j\omega C$, where R represents a resistance of the man-made microstructure, and L and C represent an inductance and a capacitance of the man-made microstructure respectively. When the electromagnetic wave propagates through each of the man-made microstructures, positive and negative charges are accumulated between the metal branches spaced apart from each other to form a capacitor of the man-made microstructure, and the metal branches per se form an inductor of the man-made microstructure. The capacitance is correlated with the area of and the spacing between the metal branches, and the inductance is correlated with the lengths of the metal branches. Therefore, the impedance can be adjusted by adjusting the dimensions of and the spacings between the metal branches.

According to the aforesaid principle, an impedance matching layer that is made of the metamaterial and has an impedance varying gradually is designed. The impedance matching layer is comprised of a plurality of metamaterial sheet layers, with an impedance of the outermost metamaterial sheet layer being identical to the impedance Z0 of the free space and an impedance of the innermost metamaterial sheet layer being identical to the impedance Zn of the conventional wave-absorbing material base. Through a series of metamaterial sheet layers, the gradual variation from the impedance Z0 to the impedance Zn is achieved to eliminate sudden transitions of the impedance between the free space and the conventional wave-absorbing material base. Thereby, it can be ensured that the electromagnetic wave incident from the free space is not reflected by the hybrid wave-absorbing material of the present disclosure.

Figure 19:
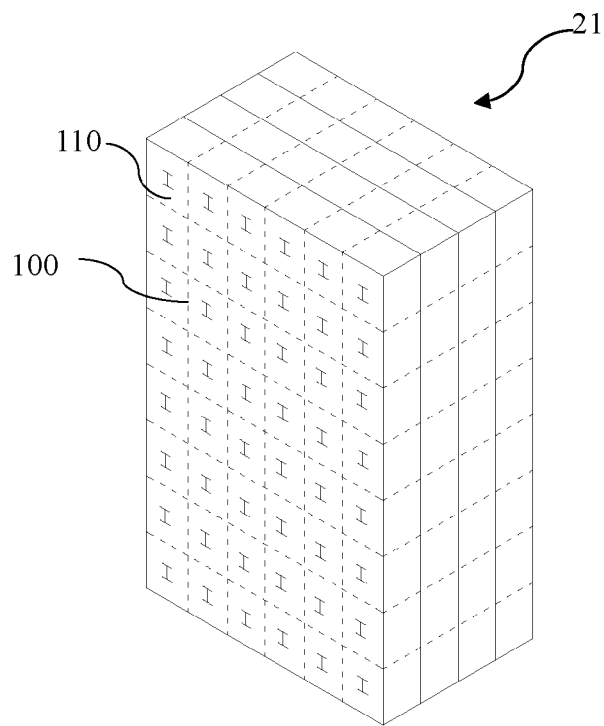
FIG. 19 is a schematic perspective view of an impedance matching layer in a first preferred embodiment of the hybrid wave-absorbing material of the present disclosure.
Figure 20:
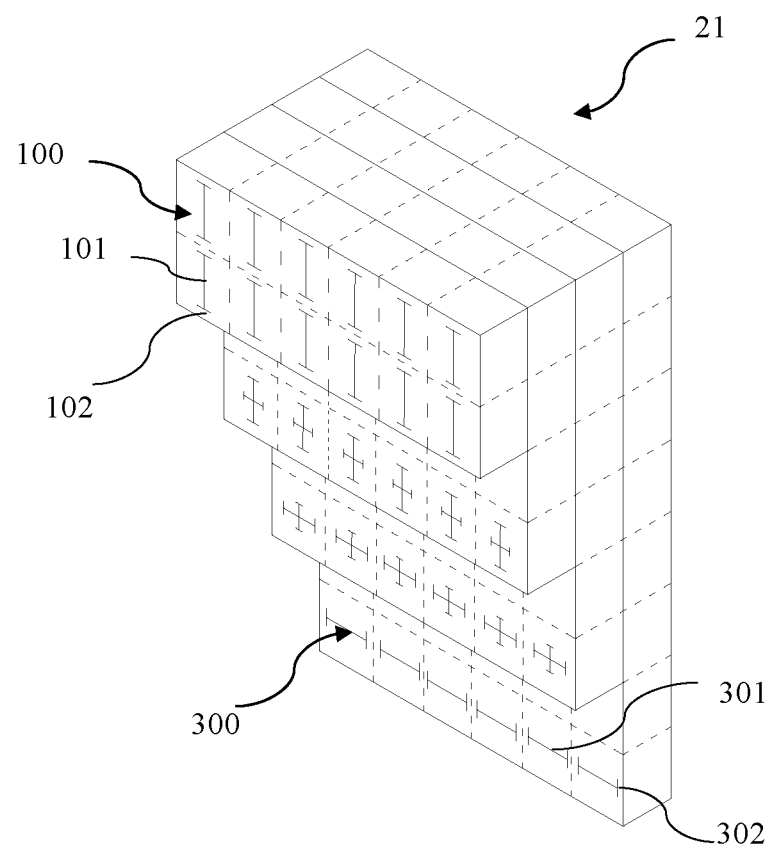
FIG. 20 is a cross-sectional view of the impedance matching layer in the first preferred embodiment of the hybrid wave-absorbing material of the present disclosure.

Referring to FIG. 19 and FIG. 20, FIG. 19 and FIG. 20 are a schematic perspective view and a cross-sectional view of an impedance matching layer in a first preferred embodiment of the hybrid wave-absorbing material of the present disclosure respectively. The number of the metamaterial sheet layers shown is only illustrative, but is not intended to limit the number of the metamaterial sheet layers of the present disclosure. The impedance matching layer 21 comprises a plurality of homogeneous metamaterial sheet layers stacked integrally in a direction perpendicular to a surface of each of the metamaterial sheet layers. Each of the metamaterial sheet layers comprises a sheet-like substrate 110 and a plurality of man-made microstructures attached on the substrate. An impedance of the outermost metamaterial sheet layer is identical to the impedance $Z_0$ of the free space, and an impedance of the innermost metamaterial sheet layer is identical to the impedance Zn of the conventional wave-absorbing material base. The so-called "homogeneous metamaterial sheet layer" means that each point of the metamaterial sheet layer has the same electromagnetic parameters. A plurality of first man-made microstructures 100 having a first pattern is attached on the outermost metamaterial sheet layer, a plurality of second man-made microstructures 300 having a second pattern is attached on the innermost metamaterial sheet layer, and patterns of man-made microstructures attached on the intermediate metamaterial sheet layers are combinations of the first pattern and the second pattern in which the first pattern decreases in size continuously in the stacking direction and the second pattern increases in size continuously in the stacking direction.

In this embodiment, each of the man-made microstructures 100 on the outermost metamaterial sheet layer is of a "I" form, which comprises a vertical first metal branch 101 and second metal branches 102 connected at two ends of the first metal branch 101 and perpendicular to the first metal branch 101 respectively. Each of the man-made microstructures 300 on the innermost metamaterial sheet layer is of an "H" form, which comprises a horizontal third metal branch 301 and fourth metal branches 302 connected at two ends of the third metal branch 301 and perpendicular to the third metal branch 301 respectively. The patterns of the man-made microstructures on the intermediate metamaterial sheet layers are combinations of the "I" form and the "H" form in which in the stacking direction of the metamaterial sheet layers, the "I" form decreases in size continuously and the "H" form increases in size continuously. Thereby, an intermediate gradient layer is formed.

Of course, in other embodiments, the impedance matching component as depicted in FIG. 1 to FIG. 17 of the present disclosure may also be adopted as the impedance matching layer of the hybrid wave-absorbing material of the present disclosure. The detailed technical features of the impedance matching component have been described in the embodiments shown in FIG. 1 to FIG. 17, and thus will not be further described herein.

The substrates of the hybrid wave-absorbing material of the present disclosure may be made of a ceramic material, a polymer material, a ferroelectric material, a ferrite material or a ferromagnetic material, and the polymer material is preferably an epoxy resin, PTFE, an F4B material or an FR4 material. The man-made microstructures may be attached on the substrates through etching, electroplating, drilling, photolithography, electron etching or ion etching. The man-made microstructures shall be arranged on each of the substrates at a spacing of one tenth to one fifth of the wavelength of an incident electromagnetic wave so as to make a continuous electromagnetic response to the incident electromagnetic wave.

The aforesaid technical solutions at least have the following benefits: according to the impedance matching component and the hybrid wave-absorbing material of the present disclosure, the impedance matching component has a graded impedance, with an impedance value thereof at a side being identical to that of a first medium and an impedance value thereof at the other side being identical to that of a second medium. The continuous changes in the intermediate portion eliminate sudden transitions of the impedance between the first medium and the second medium. Thereby, the problems of partial reflection and energy loss of the electromagnetic wave when propagating through an interface between different media are overcome. Furthermore, the hybrid wave-absorbing material of the present disclosure has improved wave-absorbing performances.

What described above are just embodiments of the present disclosure. It shall be appreciated that, many improvements and modifications may be made by those of ordinary skill in the art without departing from the principle of the present disclosure, and these improvements and modifications shall also fall within the scope of the present disclosure.

What is claimed is:

1. An impedance matching component, being disposed between a first medium and a second medium, wherein the impedance matching component comprises a plurality of functional sheet layers, each of the functional sheet layers comprises a sheet-like substrate and apertures formed on the substrate, the substrate is divided into a plurality of unit cells, each of the unit cells is formed with one or more of the apertures, and impedances of the functional sheet layers of the impedance matching component vary continuously in a stacking direction of the functional sheet layers, with the impedance of a first one of the functional sheet layers being identical to that of the first medium and the impedance of a last one of the functional sheet layers being identical to that of the second medium.

2. The impedance matching component of claim 1, wherein all the apertures have a same volume, each of the apertures is filled with a filler of a material different from the substrate, the fillers filled in the apertures on a same one of the substrates have a same dielectric permittivity, and the dielectric permittivities of the fillers filled in the apertures on different ones of the substrates increase or decrease continuously in the stacking direction.

3. The impedance matching component of claim 1, wherein the apertures on a same one of the substrates have a same volume, and the apertures on different ones of the substrates increase or decrease in volume continuously in the stacking direction of the functional sheet layers.

4. The impedance matching component of claim 3, wherein all the apertures have a same depth, the apertures on the same one of the substrates have a same cross-sectional shape, and cross-sectional areas of the apertures on the different ones of the substrates vary continuously in the stacking direction of the functional sheet layers.

5. The impedance matching component of claim 3, wherein all the apertures have a same cross-sectional area, the apertures on the same one of the substrates have a same cross-sectional shape, and the apertures on the different ones of the substrates vary in depth continuously in the stacking direction of the functional sheet layers.

6. The impedance matching component of claim 3, wherein each of the substrates is formed with a plurality of said apertures identical in volume to each other, each of the unit cells on the same one of the substrates is formed with a same number of said apertures, and the numbers of the apertures in each of the unit cells on the different ones of the substrates increase or decrease continuously in the stacking direction of the functional sheet layers.

7. The impedance matching component of claim 3, wherein each of the apertures is filled with a filler of a same material, and the material of the filler is different from that of the substrate.

8. An impedance matching component, being disposed between a first medium and a second medium, wherein the impedance matching component comprises a plurality of metamaterial sheet layers parallel to each other and stacked in a direction perpendicular to a surface of each of the metamaterial sheet layers, each of the metamaterial sheet layers comprises a substrate and a plurality of man-made microstructures attached on the substrate, the substrate is divided into a plurality of lattices in which the man-made microstructures are located, each of the lattices and the corresponding man-made microstructure(s) formed thereon form one unit cell, and impedances of the unit cells of the impedance matching component vary continuously in a stacking direction of the metamaterial sheet layers, with the impedance of the unit cells of a first one of the metamaterial sheet layers and the impedance of the unit cells of a last one of the metamaterial sheet layers being identical to an impedance of the first medium and an impedance of the second medium with which the first one of the metamaterial sheet layers and the last one of the metamaterial sheet layers are in contact respectively.

9. The impedance matching component of claim 8, wherein both the first medium and the second medium are homogeneous media, and the impedance matching component comprises a plurality of said metamaterial sheet layers each having a uniform impedance arrangement.

10. The impedance matching component of claim 9, wherein the man-made microstructures of all the metamaterial sheet layers of the impedance matching component have a same pattern, and the man-made microstructures of the metamaterial sheet layers vary in size continuously in the stacking direction of the metamaterial sheet layers.

11. The impedance matching component of claim 10, wherein each of the man-made microstructures comprises two first metal wires perpendicular to each other and connected in a "+" form, second metal wires connected at two ends of each of the first metal wires respectively and perpendicular to the respective first metal wires, third metal wires connected at two ends of each of the second metal wires respectively and perpendicular to the respective second metal wires, and so on.

12. The impedance matching component of claim 10, wherein each of the man-made microstructures comprises three first metal wires perpendicular to each other in a three-dimensional (3D) space and intersecting with each other at a point, second metal wires connected at two ends of each of the first metal wires respectively and perpendicular to the respective first metal wires, third metal wires connected at two ends of each of the second metal wires respectively and perpendicular to the respective second metal wires, and so on.

13. The impedance matching component of claim 10, wherein each of the man-made microstructures is of a non-axially symmetric configuration.

14. The impedance matching component of claim 10, wherein each of the man-made microstructures is of a "I" form, which comprises a first metal wire and two second metal wires connected at two ends of the first metal wire and perpendicular to the first metal wire respectively.

15. The impedance matching component of claim 14, wherein each of the man-made microstructures further comprises third metal wires connected at two ends of each of the second metal wires respectively and perpendicular to the respective second metal wires, fourth metal wires connected at two ends of each of the third metal wires respectively and perpendicular to the respective third metal wires, and so on.

16. The impedance matching component of claim 15, wherein each of the second metal wires has a length smaller than that of the first metal wire, each of the third metal wires has a length smaller than that of each of the second metal wires, each of the fourth metal wires has a length smaller than that of each of the third metal wires, and so on.

17. A hybrid wave-absorbing material, comprising an attenuating layer and an impedance matching layer, wherein the impedance matching layer comprises a plurality of homogeneous metamaterial sheet layers, the metamaterial sheet layers are stacked integrally in a direction perpendicular to a surface of each of the metamaterial sheet layers, and impedances of the metamaterial sheet layers vary gradually in the stacking direction of the metamaterial sheet layers, with the impedance of the outermost metamaterial sheet layer being identical to that of a free space and the impedance of the innermost metamaterial sheet layer being identical to that of the attenuating layer.

18. The hybrid wave-absorbing material of claim 17, wherein each of the metamaterial sheet layers comprises a substrate and a plurality of identical man-made microstructures arranged periodically in an array form on the substrate; a plurality of first man-made microstructures having a first pattern is attached on the outermost metamaterial sheet layer, a plurality of second man-made microstructures having a second pattern is attached on the innermost metamaterial sheet layer, and patterns of the man-made microstructures attached on intermediate ones of the metamaterial sheet layers are all combinations of the first pattern and the second pattern in which the first pattern decreases in size continuously and the second pattern increases in size continuously in the stacking direction of the metamaterial sheet layers.

19. The hybrid wave-absorbing material of claim 17, wherein each of the metamaterial sheet layers comprises a substrate and a plurality of identical man-made microstructures arranged periodically in an array form on the substrate, and the man-made microstructures attached on the metamaterial sheet layers have a same geometric shape and vary in size gradually in the stacking direction of the metamaterial sheet layers, with the man-made microstructures of the outermost metamaterial sheet layer having a smallest size and the man-made microstructures of the innermost metamaterial sheet layer having a greatest size.

20. The hybrid wave-absorbing material of claim 19, wherein each of the man-made microstructures is of a "I" form, which comprises a first metal branch and second metal branches connected at two ends of the first metal branch and perpendicular to the first metal branch respectively.

* * * * *